(12) United States Patent
Hsu et al.

(10) Patent No.: US 9,490,769 B1
(45) Date of Patent: *Nov. 8, 2016

(54) VERTICAL DIFFERENTIAL RESONATOR

(71) Applicant: Micrel, Incorporated, San Jose, CA (US)

(72) Inventors: Wan-Thai Hsu, Saline, MI (US); Guohong He, Ann Arbor, MI (US); John Ryan Clark, Howell, MI (US)

(73) Assignee: Micrel, Incorporated, San Jose, CA (US)

( * ) Notice: Subject to any disclaimer, the term of this patent is extended or adjusted under 35 U.S.C. 154(b) by 170 days.

This patent is subject to a terminal disclaimer.

(21) Appl. No.: 14/514,096

(22) Filed: Oct. 14, 2014

Related U.S. Application Data

(63) Continuation of application No. 13/294,950, filed on Nov. 11, 2011, now Pat. No. 8,878,633.

(60) Provisional application No. 61/539,912, filed on Sep. 27, 2011.

(51) Int. Cl.
  *H03H 9/24* (2006.01)
  *H03H 9/05* (2006.01)
  (Continued)

(52) U.S. Cl.
  CPC .............. *H03H 9/0023* (2013.01); *H03B 5/30* (2013.01); *H03H 9/02244* (2013.01); *H03H 9/02259* (2013.01); *H03H 9/02338* (2013.01);
  (Continued)

(58) Field of Classification Search
  CPC ........... H03H 9/0023; H03H 9/02244; H03H 9/02259; H03H 9/02338; H03H 9/02409; H03H 9/02417; H03H 9/02448; H03H 9/2405; H03H 9/2431; H03H 9/2447; H03H 9/2452; H03H 9/2457; H03H 9/2463; H03H 9/505; H03H 9/0542; H03H 2009/02244; H03H 2009/02259; H03H 2009/02291; H03H 2009/02354; H03H 2009/02503; H03H 2009/02511; H03H 2007/006; H03H 2007/008
  USPC .......................... 333/186, 197–200; 310/309
  See application file for complete search history.

(56) References Cited

U.S. PATENT DOCUMENTS

| | | | | |
|---|---|---|---|---|
| 3,614,678 A | * | 10/1971 | Engeler | H03H 9/56 257/417 |
| 6,249,073 B1 | | 6/2001 | Nguyen et al. | |

(Continued)

OTHER PUBLICATIONS

M. U. Demirci et al.; "Higher-Mode Free-Free Beam Micromechanical Resonators"; Proceedings of the 2003 IEEE International Frequency Control Symposium and PDA Exhibition Jointly with the 17th European Frequency and Time Forum, May 4-8, 2003, ppl. 810-818.*

(Continued)

*Primary Examiner* — Barbara Summons
(74) *Attorney, Agent, or Firm* — Lempia Summerfield Katz LLC

(57) ABSTRACT

A micromechanical device includes a substrate, a micromechanical structure supported by the substrate and configured for overtone resonant vibration relative to the substrate, and a plurality of electrodes supported by the substrate and spaced from the micromechanical structure by respective gaps. The plurality of electrodes include multiple drive electrodes configured relative to the micromechanical structure to excite the overtone resonant vibration with a differential excitation signal, or multiple sense electrodes configured relative to the micromechanical structure to generate a differential output from the overtone resonant vibration.

20 Claims, 11 Drawing Sheets

(51) Int. Cl.
*H03H 9/46* (2006.01)
*H03H 9/50* (2006.01)
*H03H 9/52* (2006.01)
*H03H 9/00* (2006.01)
*H03B 5/30* (2006.01)
*H03H 9/02* (2006.01)

(52) U.S. Cl.
CPC ......... *H03H9/2447* (2013.01); *H03H 9/2452* (2013.01); *H03H 9/505* (2013.01); *H03H 2009/02291* (2013.01); *H03H 2009/02354* (2013.01); *H03H 2009/02511* (2013.01)

(56) References Cited

U.S. PATENT DOCUMENTS

| | | | |
|---|---|---|---|
| 6,557,419 B1 | 5/2003 | Herb et al. | |
| 6,710,680 B2* | 3/2004 | Niu | B81B 3/007 257/415 |
| 6,734,762 B2* | 5/2004 | Cornett | H03H 3/007 257/415 |
| 7,071,793 B2 | 7/2006 | Lutz et al. | |
| 7,323,952 B2 | 1/2008 | Pan et al. | |
| 7,595,708 B2 | 9/2009 | Lutz et al. | |
| 7,755,454 B2* | 7/2010 | Tanaka | H02N 1/006 333/186 |
| 7,806,586 B2 | 10/2010 | Melamud et al. | |
| 8,878,633 B1* | 11/2014 | Hsu | H03H 9/0023 310/309 |
| 2001/0022546 A1* | 9/2001 | Frey | H03H 9/02425 333/197 |

OTHER PUBLICATIONS

Chiung-Cheng Lo et al., "Integrated HF CMOS-MEMS Square-Frame Resonators with On-Chip Electronics and Electrothermal Narrow Gap Mechanism", Tranducers '05, The 13th International Conference on Solid-State Sensors, Actuators and Microsystems, Jun. 5-9, 2005, pp. 2074-2077, Seoul, Korea.

Dubravka Bilic et al., "Third Harmonic Double-Ended Tuning Fork Resonator", Tranducers, Conference paper, 1999, 2 pages.

Yuan Xie et al., "1.52-GHz Micromechanical Extensional Wine-Glass Mode Ring Resonators", IEEE Transactions on Ultrasonics, Ferroelectrics, and Frequency Control, Apr. 2008, pp. 890-907, vol. 55, No. 4.

* cited by examiner

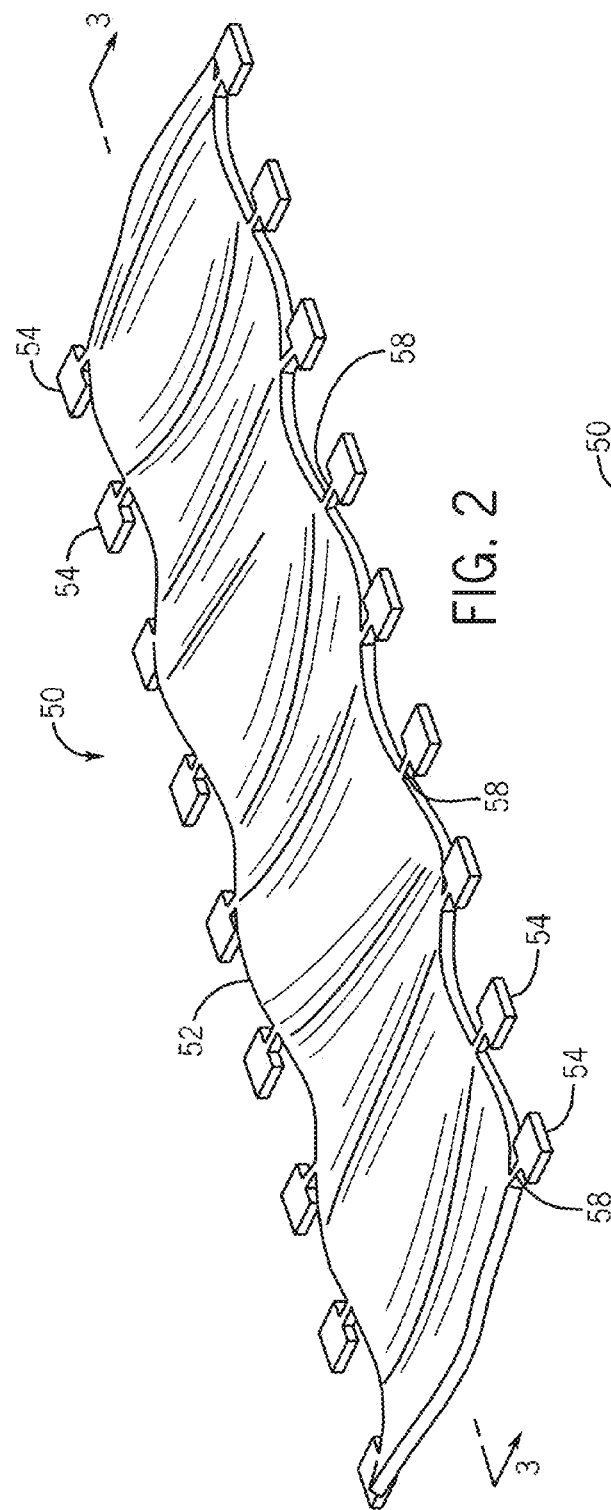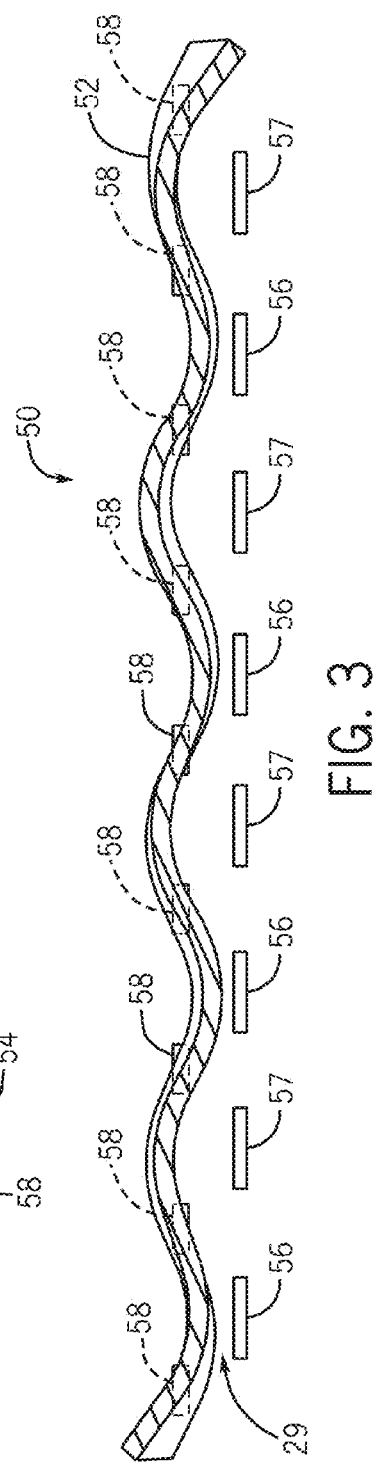

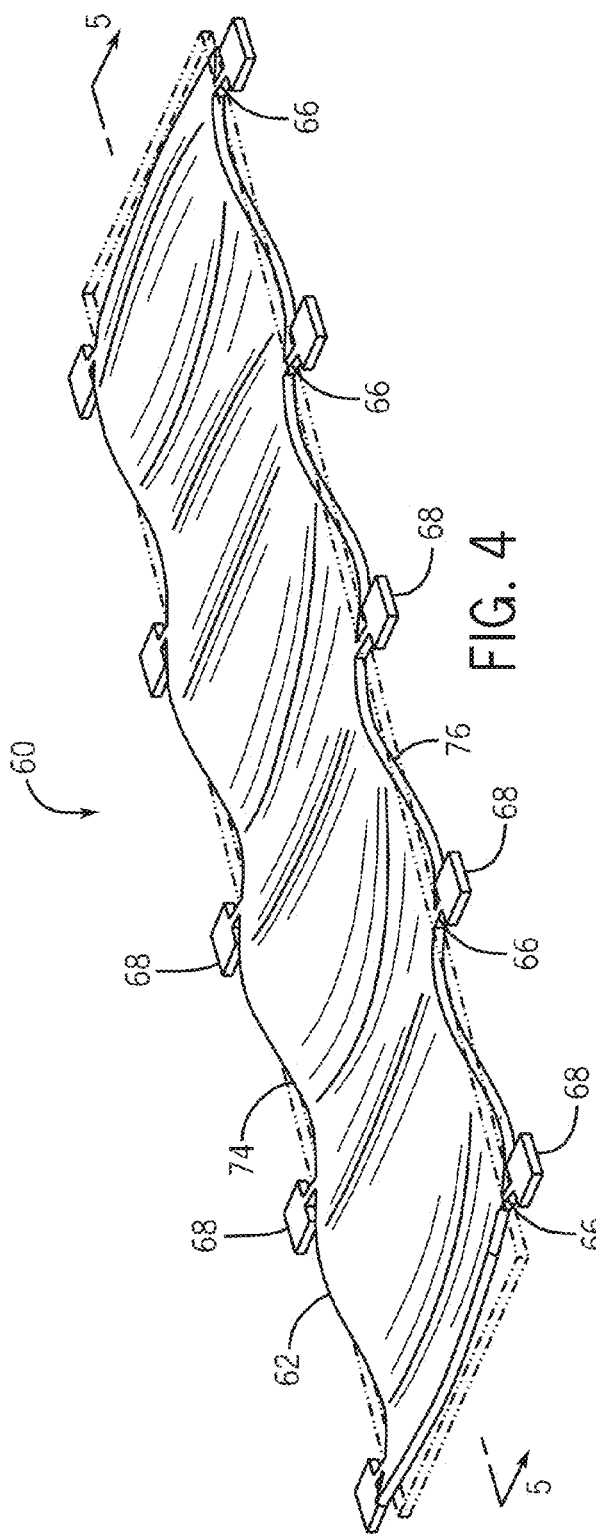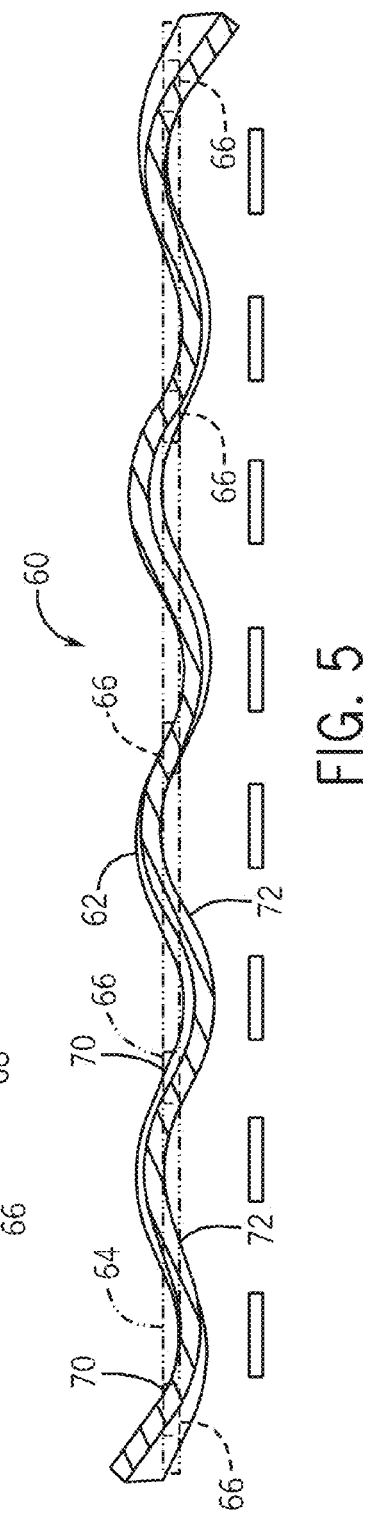

VERTICAL DIFFERENTIAL RESONATOR

CROSS-REFERENCES TO RELATED APPLICATIONS

This application is a continuation of U.S. non-provisional application entitled "Vertical Differential Resonator," now U.S. Pat. No. 8,878,633, filed Nov. 1, 2011, and assigned Ser. No. 13/294,950, which, in turn, claims the benefit of U.S. provisional application entitled "Vertical Differential Resonator," filed Sep. 27, 2011, and assigned Ser. No. 61/539,912, the entire disclosures of which are hereby expressly incorporated by reference.

BACKGROUND OF THE DISCLOSURE

1. Field of the Disclosure

The disclosure relates generally to micromechanical devices or micro-electromechanical systems (MEMS) and, more particularly, to micromechanical or MEMS resonators.

2. Brief Description of Related Technology

Micromechanical resonators have been constructed in accordance with so-called "free-free" designs. A free-free beam resonator contrasts from, for instance, a clamped-clamped beam resonator in which a resonant beam is clamped, or anchored, at the ends of the beam. Free-free beam resonators are typically fabricated via surface micromachining processes, vibrate in a direction vertically relative to the substrate, and exhibit good resonance performance for MEMS timing products.

Free-free beam resonator designs have utilized short support structures. Examples of free-free beam resonators with short support structures are described in U.S. Pat. No. 6,930,569, the entire disclosure of which is hereby incorporated by reference.

Some free-free beam resonator designs have presented drawbacks in performance, including inadequate power handling (or linearity) in which the output frequency varies at a level around −20 dBm. In contrast, quartz crystal resonators often operate at a level of 0 dBm. Improvements in power handling may lead to better phase noise performance of an oscillator driven by the resonator. As a result, MEMS oscillators have often exhibited worse phase noise than quartz crystal oscillators.

SUMMARY OF THE DISCLOSURE

In accordance with one aspect of the disclosure, a micromechanical device includes a substrate, a micromechanical structure supported by the substrate and configured for overtone resonant vibration relative to the substrate, and a plurality of electrodes supported by the substrate and spaced from the micromechanical structure by respective gaps. The plurality of electrodes include multiple drive electrodes configured relative to the micromechanical structure to excite the overtone resonant vibration with a differential excitation signal, or multiple sense electrodes configured relative to the micromechanical structure to generate a differential output from the overtone resonant vibration.

The micromechanical device may further include a plurality of support structures anchored to the substrate, each support structure being coupled to the micromechanical structure at a respective nodal point of a set of nodal points of the micromechanical structure for the overtone resonant vibration. In some embodiments, the plurality of support structures do not support the micromechanical structure at each nodal point of the set of nodal points. Alternatively or additionally, the set of nodal points includes supported nodal points and unsupported nodal points supported and not supported by a respective one of the plurality of support structures, respectively. Alternatively or additionally, the supported and unsupported nodal points are disposed in a symmetrical arrangement along the micromechanical structure. The symmetrical arrangement may then dispose each of the supported nodal points adjacent to one of the unsupported nodal points. Alternatively or additionally, the symmetrical arrangement includes matching locations of the supported and unsupported nodal points on opposing sides of the resonant structure.

In some embodiments, the overtone resonant vibration is a flexural vibration mode. Alternatively or additionally, the overtone resonant vibration includes vibration in a direction transverse to the substrate. Alternatively or additionally, the micromechanical structure includes a beam configured for the overtone resonant vibration and spaced from the plurality of electrodes by the respective gaps. The beam may have a curved shape oriented in parallel with the substrate. The curved shape may be annular.

In some cases, the overtone resonant vibration is at an overtone resonant frequency for the 15th overtone of a fundamental resonant frequency of the micromechanical structure.

The plurality of electrodes may include the multiple drive electrodes configured relative to the micromechanical structure to excite the overtone resonant vibration with the differential excitation signal and the multiple sense electrodes configured relative to the micromechanical structure to generate the differential output from the overtone resonant vibration. The multiple drive electrodes and the multiple sense electrodes may then be biased at different voltages relative to the resonant structure.

In some embodiments, the micromechanical structure includes a dielectric core.

In accordance with another aspect of the disclosure, a micromechanical device includes a substrate, a plurality of support structures anchored to the substrate, a micromechanical structure supported by the substrate via the plurality of support structures and configured for overtone resonant vibration relative to the substrate, the overtone resonant vibration having a set of nodal points along the micromechanical structure, and a plurality of electrodes spaced from the micromechanical structure by respective gaps, the plurality of electrodes including multiple drive electrodes configured to excite the overtone resonant vibration with a differential excitation signal, and further including multiple sense electrodes configured to generate a differential output from the overtone resonant vibration. Each support structure of the plurality of support structures is disposed at a respective nodal point of the set of nodal points. The micromechanical structure is not supported at each nodal point of the set of nodal points by a respective one of the plurality of support structures.

In some embodiments, the plurality of support structures are disposed in a symmetrical arrangement along the micromechanical structure. The symmetrical arrangement may divide the set of nodal points into an equal number of supported and unsupported nodal points.

The overtone resonant vibration may be a flexural vibration mode. Alternatively or additionally, the overtone resonant vibration includes vibration in a direction transverse to the substrate. Alternatively or additionally, the micromechanical structure includes a beam configured for the overtone resonant vibration and spaced from the plurality of electrodes by the respective gaps. The beam may have a curved shape oriented in parallel with the substrate. The curved shape may be annular.

BRIEF DESCRIPTION OF THE DRAWING FIGURES

For a more complete understanding of the disclosure, reference should be made to the following detailed description and accompanying drawing figures, in which like reference numerals identify like elements in the figures.

FIG. 2 shows a schematic, partial, perspective view of an exemplary micromechanical resonator device during overtone resonant vibration in accordance with one embodiment.

FIG. 3 is a schematic, partial, cross-sectional view of the micromechanical resonator device of FIG. 2 taken along lines 3-3 of FIG. 2.

FIG. 4 shows a schematic, partial, perspective view of an exemplary micromechanical resonator device during overtone resonant vibration in accordance with another embodiment having one or more missing support structures.

FIG. 5 is a schematic, partial, cross-sectional view of the micromechanical resonator device of FIG. 4 taken along lines 5-5 of FIG. 4.

Figure 1:
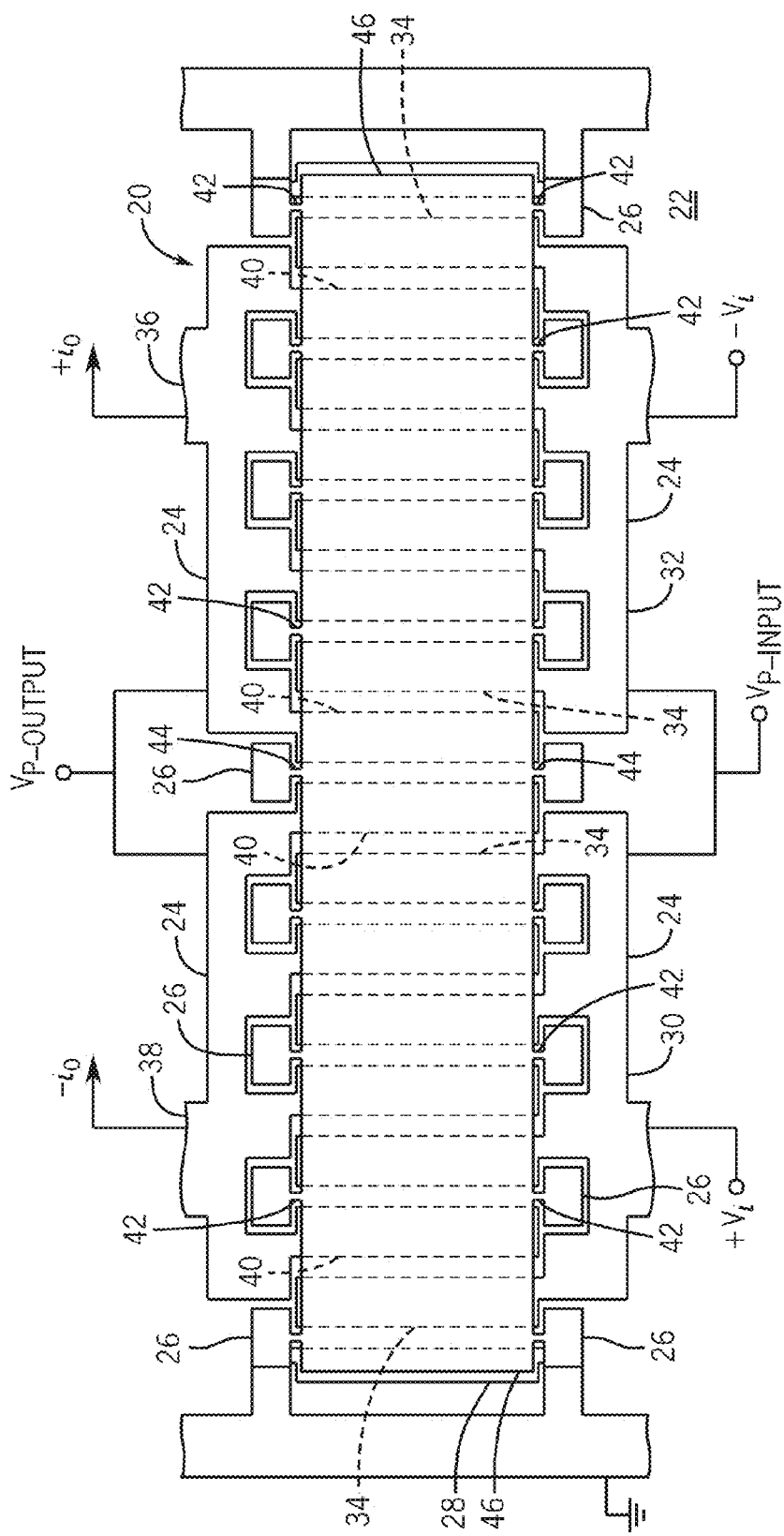
FIG. 1 is a schematic, layout view of an exemplary micromechanical resonator device configured for overtone resonant vibration and differential operation in accordance with one or more aspects of the disclosure.
Figure 6:
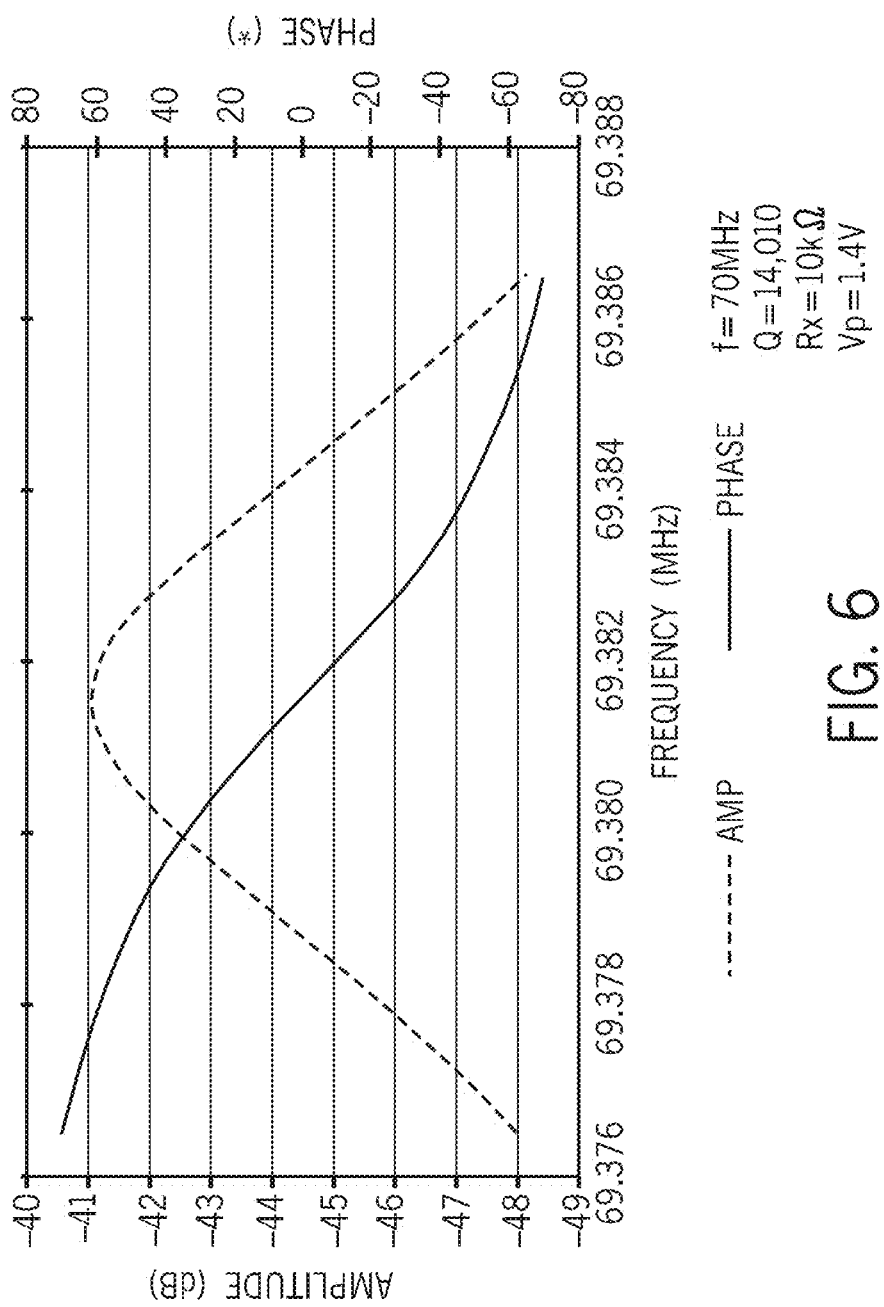
FIG. 6 is a graphical plot depicting the operational performance of the exemplary micromechanical resonator device of FIG. 4.

While the disclosed devices are susceptible of embodiments in various forms, there are illustrated in the drawing (and will hereafter be described) specific embodiments of the invention, with the understanding that the disclosure is intended to be illustrative, and is not intended to limit the invention to the specific embodiments described and illustrated herein.

DETAILED DESCRIPTION OF THE DISCLOSURE

The disclosure relates to high performance MEMS resonator designs. The disclosed resonators may be useful in a variety of timing and communication applications. In one aspect, the disclosure relates to MEMS or other micromechanical resonator devices configured for differential operation. The differential operation may be fully differential. As described below, the fully differential resonators may accordingly include a number of electrodes in multiples of four (e.g., positive input, negative input, positive output, negative output). In some embodiments, the differential operation includes a single-ended input or a single-ended output. Alternatively or additionally, the disclosure relates to micromechanical resonator devices configured for high mode, overtone operation. In fully differential embodiments, the overtone mode may accordingly be one of the overtones in the $2^n-1$ sequence, e.g., third, seventh, 15th, $31^{st}$, etc.

In some embodiments, the disclosed micromechanical resonator devices are configured for resonant vibration at an overtone of a fundamental resonant frequency of the micromechanical resonator device. Such overtone resonant vibration provides multiple electrode locations, which may be suitable for developing non-inverting and inverting output signals. Multiple electrode locations may also be provided for differential inputs via such overtone resonant vibration, thereby supporting fully differential operation.

In another aspect of the disclosure, the micromechanical resonator device is not supported at each nodal point established during the overtone resonant vibration. A micromechanical structure of the resonator device configured for the overtone resonant vibration may be supported by a number of support arms or other structures, each one of which is disposed at a respective nodal point of the overtone resonant vibration. In some embodiments, one or more nodal points may be missing a support structure. For example, the support arms may be skipped at every other nodal point, and/or the support arms may be aligned with one another in a laterally symmetrical arrangement. A variety of symmetrical arrangements of the support structures may be used (e.g., a support structure at every third nodal point).

The disclosed resonators may exhibit improved power handling characteristics. For example, the disclosed resonators may exhibit linearity at levels equal to those of quartz crystal resonators. The high mode and/or other aspects of the disclosed resonators may lead to these operational improvements.

The disclosed resonator designs may avoid the limitations of single-ended MEMS resonators. Because MEMS resonators are typically small, the size of an electrode is very small. The disclosed resonator designs address the difficulty of building a MEMS resonator with multiple electrodes with 180 phase difference for differential resonator operation. The differential operation of the disclosed resonators may lead to decreased sensitivity to electromagnetic interference.

The disclosed resonator designs may address limitations on operational frequency. The size of drive/sense electrode(s) of a typical free-free beam resonator often decreases with higher operating frequencies of the resonator. As a result, the motional impedance is often high for high frequency resonators. The overtone operation of the disclosed resonator devices may address this challenge.

In some embodiments, the disclosed devices include a higher mode overtone free-free beam resonator with short support structures. Each support structure may include a beam-shaped arm coupling the resonant structure to respective substrate anchors. The support structures are placed at the nodal points for a high overtone mode shape.

The micromechanical structure configured for resonant vibration may also be beam-shaped. The beam shape may be curved to any desired extent. For example, the micromechanical structure may be annular.

Although described in connection with a number of examples of free-free, short support resonator devices, one or more aspects of the disclosure are applicable to other types of micromechanical resonator devices. The resonator devices need not be disposed in a free-free configuration. The length and other characteristics of the support structures may vary from the examples described. Other aspects of the devices may vary as well, including, for instance, the orientation of the vibration mode and/or the type of vibration mode. For example, one or more aspects of the disclosure may be applied to lateral vibration mode device configurations, and one or more aspects of the disclosure may be applied to bulk acoustic mode devices configurations.

FIG. 1 shows an exemplary MEMS resonator device 20 constructed in accordance with one embodiment. The device 20 includes a substrate 22 on which one or more electrodes 24 and a number of anchors 26 are disposed and/or by which the electrode(s) 24 and the anchor(s) 26 are supported. The anchors 26, in turn, support a resonant structure 28 in a cantilevered, suspended, or other spaced position relative to the substrate 22 and the electrode(s) 24. The resonant structure 28 may be a surface micro-machined, bulk micro-machined or other micromechanical structure. The resonant structure 28 is supported by the substrate 22 (e.g., via the anchors 26) and configured for resonant vibration relative to the substrate 22 in a gap 29 (FIG. 3) between the electrode(s) 24 and the resonant structure 28. To that end, the resonant structure 28 may include one or more conductive materials, surfaces, and/or regions for electrostatic excitation. As described below, the resonant vibration may include overtone resonant vibration.

The resonant structure 28 may be biased at a DC voltage $V_p$ relative to the electrode(s) 24. The bias voltage Vp may be used to pull down or otherwise draw the resonant structure 28 toward the electrode(s) 24 to promote vibration, increase stiffness, resonant frequency, etc. The excitation of the resonant structure 28 results in vibration at a fundamental (or other) resonant frequency of the resonant structure 28. The DC bias voltage may be applied to the resonant structure 28 via one or more of the anchors 26. In this example, the bias voltage is established by tying one or more of the anchors 26 (e.g., outermost anchors) to ground as shown, and by biasing the electrodes 24 at one or more voltage levels relative to ground. In the example of FIG. 1, two different bias voltages are established, $V_{p\text{-}input}$ and $V_{P\text{-}output}$, by applying different voltages to the electrodes 24 based on whether the electrodes 24 are directed to input or output functions. Thus, half (e.g., eight) of the electrodes 24 may be tied to $V_{p\text{-}input}$, and the other half (e.g., eight) of the electrodes 24 may be tied to $V_{P\text{-}output}$. The arrangement of different bias voltages may provide flexibility during operation. For example, the different bias voltages may allow the resonator operating point of the device 20 to be tuned. In one embodiment, a lower $V_{p\text{-}input}$ (e.g., relative to the other bias voltage) may be used to send more drive voltage into the resonant structure 28. Alternatively or additionally, a higher $V_{P\text{-}output}$ (e.g., relative to the other bias voltage) may be used to increase output current. Such bias voltage arrangements may lead to improved power handling.

In this example, the resonant structure 28 is driven differentially via an AC input or drive signal $v_i$ applied to one or more positive (or non-inverted) drive or input electrodes 30 and an inverted drive signal $-v_i$ applied to one or more negative (or inverted) drive or input electrodes 32. Together the non-inverted and inverted drive signals are applied to the drive electrodes 30, 32 to excite the resonant structure 28 into vibration. Each drive electrode 30, 32 is positioned to drive the resonant structure 28 into resonant vibration via the drive signals. In this example, each drive electrode 30, 32 includes a number of finger-shaped strips or other component structures 34 disposed on or otherwise above the substrate 22 and yet under the resonant structure 28. Each finger-shaped strip 34 may be spaced from the resonant structure 28 by the gap 29 (FIG. 3). Each finger-shaped strip 34 may extend across a width of the resonant structure 28 as shown, but the length, shape, and other characteristics of this component or section of the electrodes 30, 32 may vary from the example shown. Each strip 34 may be considered a separate electrode of the drive electrodes 30, 32. Viewed in that way, the resonator device 20 includes four positive drive electrodes and four negative drive electrodes. More generally, the multiple drive electrodes 30, 32 are configured relative to the resonant structure 28 to excite the resonant vibration (e.g., overtone resonant vibration) with a differential excitation signal.

The example of FIG. 1 is configured as a fully differential resonator device. The output of the device 20 is sensed differentially by one or more positive or non-inverting sense electrodes 36 as a sense current $i_0$ and by one or more negative or inverting sense electrodes 38 as a sense current $-i_0$. The output of the disclosed devices may alternatively or additionally be sensed as a voltage. Each sense electrode 36, 38 is positioned to sense the resonant vibration of the resonant structure 28. In this example, each sense electrode 36, 38 includes a number of finger-shaped strips or other component structures 40 disposed on or otherwise above the substrate 22 and yet under the resonant structure 28. Each finger-shaped strip 40 may be spaced from the resonant structure 28 by the gap (FIG. 3). Each finger-shaped strip 40 may extend across a width of the resonant structure 28 as shown, but the length, shape, and other characteristics of this component or section of the electrodes 36, 38 may vary from the example shown. Each strip 40 may be considered a separate electrode of the sense electrodes 36, 38. Viewed in that way, the resonator device 20 includes four positive sense electrodes and four negative sense electrodes. More generally, the multiple sense electrodes 36, 38 are configured relative to the resonant structure 28 to generate a differential output from the resonant vibration (e.g., overtone resonant vibration). In other embodiments, the electrodes 24 may be configured for either single-ended excitation or single-ended output. In the former case, the electrodes 24 include the positive and negative input electrodes 30, 32, as described above, but only a single output signal is captured. In the latter case, the electrodes 24 include the positive and negative output electrodes 36, 38, but only a single input signal is applied to excite the device 20.

The resonant structure 28 may be coupled to the anchors 26 via a number of support structures 42, which may be configured as arms extending between the anchors 26 and the resonant structure 28. The support structures 42 are thus anchored to the substrate 22. For example, each support structure 42 may be a beam-shaped arm that couples the resonant structure 28 to one of the anchors 26. Each support structure 42 in this example is attached to the resonant structure 28 at respective nodal point of a set of nodal points of an overtone mode of the fundamental resonant frequency of the resonant structure 42. Resonance at the harmonic frequency of the overtone mode is established during operation via application of the drive signals at appropriate positions along the resonant structure 28. As described below, the resonant structure 28 may be configured to resonate at various harmonics of the fundamental resonant frequency of the resonant structure 28. The example of FIG. 1 is configured to resonate at an overtone resonant frequency for the $15^{th}$ overtone, or $16^{th}$ harmonic frequency, of the fundamental resonant frequency of the resonant structure 28.

The support structures 42 may be disposed in a symmetrical arrangement. In this example, the symmetry is lateral, e.g., across the width of the resonant structure 28. Each support structure 42 on one side of the resonant structure 28 is aligned with a corresponding one of the support structures 42 on the opposing side of the resonant structure 28. The arrangement is also symmetrical along the other lateral dimension of the resonant structure 28, e.g., across the length of the resonant structure 28. The support structures 42 are symmetrical about a center line passing through center support structures 44. These lateral symmetries may also be exhibited in other support structure arrangements described herein.

The resonator device 20 has a free-free configuration in the sense that the resonant structure 28 is supported and spaced from the substrate 22 and the electrodes 24 with free ends 44 as opposed to clamped or otherwise fixed ends. The free-free resonator configuration may minimize losses to the substrate 22, but other embodiments may include one or more clamped or fixed ends. The example of FIG. 1 may further minimize such losses by designing the support structures 42 to have a length selected in view of the harmonic frequency of the overtone mode. For example, each support structure 42 may have a length substantially less than a quarter-wavelength of the harmonic frequency. Further details regarding such short support arms are set forth in U.S. Pat. No. 6,930,569 ("Micromechanical resonator having short support arms"), the entire disclosure of which is incorporated by reference. Notwithstanding the advantages of short support arms, one or more of the support structures 42 may be alternatively configured with, for instance, a length equal to a quarter-wavelength.

In this example, the resonant structure 28 is beam-shaped for a flexural mode of vibration. The vibration mode primarily includes movement in a direction vertical or transverse to the plane of the substrate 22. The electrodes 24 and the resonant structure 28 may thus be oriented relative to one another for vibration of the resonant structure transverse to the substrate 22. In other examples, the flexural mode of vibration includes movement in a direction lateral or parallel to the plane of the substrate 22. The vibration mode need not be flexural and instead may be based on movement involving, for instance, expansion and contraction of the resonant structure 28. Thus, the vibration mode may be a bulk acoustic mode.

The above-described components of the device 20 may be formed via surface micromachining fabrication techniques, examples of which are described below. The electrodes 24 and the anchors 26 may be made of polysilicon or other conductive materials. The polysilicon regions of the structures may be doped (e.g., n-type or p-type) to a dopant concentration sufficient to reach a desired conductivity level. The anchors 26 may be integrally formed with the resonant structure 28, which may thus include polysilicon as well.

The device 20 may include varying numbers of electrodes and anchors. In this example, the device 20 includes one or more outer electrodes 46 biased at the same voltage (e.g., ground) as the resonant structure 28. The outer electrodes 46 are disposed under lateral ends of the resonant structure 28 to prevent the resonant structure from contacting during vibration a structure or layer (e.g., a nitride layer) disposed at a different voltage (e.g., a floating or otherwise uncontrolled voltage). With the outer electrodes 46 and the resonant structure 28 disposed at the same voltage, any such contact is not problematic. The electrodes 46 may also provide mechanical balance for the device 20. The shape, size, positioning, and other characteristics of the electrodes and anchors may vary considerably from the example shown. For example, the device 20 need not have integrated electrodes branching out from a common terminal, and instead may be configured with non-integrated sense and drive electrodes spaced from the resonant structure 28. The device 20 may also include any number of such distinct or discrete sense electrodes, and any number of such distinct or discrete drive electrodes. The structural support, bias, and excitation framework and arrangement of the device 20 may vary considerably from the example shown.

In some cases, the substrate 22 may include a silicon or other semiconductor base, or original substrate, along with various types of semiconductor, insulating, or other layers, such as epitaxial layers, formed thereon. The electrodes 24, the anchors 26, and other components of the device 20 need not be disposed directly on the substrate 22, and instead may be supported indirectly by the substrate 22 via any number of such intervening layers.

Further details regarding the device 20, one or more of its constituent structures, and/or the fabrication of the device 20 and/or its constituent structures may be found in the above-referenced U.S. Patent, as well as U.S. Pat. No. 6,249,073 ("Device including a micromechanical resonator having an operating frequency and method of extending same"), the entire disclosure of which is incorporated by reference. The device 20 may include one or more components directed to temperature compensation, the techniques of which may be applied either separately or in combination with one or more other temperature compensation techniques (e.g., mechanical, electrical, oven-based, etc.), such as those described in U.S. Patent Publication No. 2002/0069701 ("Micromechanical resonator device") and U.S. Pat. No. 7,449,968 ("Frequency and temperature compensation synthesis for a MEMS resonator"), the entire disclosures of which are incorporated by reference.

The device 20 is shown in schematic form in FIG. 1 and the other drawing figures hereof for convenience in illustration, and may include a number of other components in certain applications or operational configurations. For example, the lateral and other dimensions of the structures depicted in FIG. 1 may be exaggerated and out of scale for ease in illustration. As shown and described herein, the shape, size, and other characteristics of the resonant structure 28 may vary considerably from the beam-shaped example of FIG. 1. For example, the resonant structure 28 need not be made of polysilicon. In some cases, the resonant structure 28 includes a dielectric or other temperature compensating core as described in U.S. patent application Ser. No. 11/315,436 ("Temperature Compensated Resonator with Dielectric Core"), the entire disclosure of which is incorporated by reference. The shape and other characteristics of the resonant beam may also vary from the example of FIG. 1, as shown and described in connection with the curved beam example of FIG. 11. The differential operation, overtone mode, and other aspects of the disclosure may be incorporated into a wide variety of resonant structures with any manner of structural complexity (e.g., trusses, shuttles, multiple beam construction, etc.).

FIGS. 2 and 3 show another exemplary micromechanical resonator device 50 configured in accordance with one or more aspects of the disclosure. The device 50 is illustrated during operation in a flexural overtone resonant mode. The device 50 includes a resonant structure 52 supported by anchors 54 (FIG. 2) in a free-free resonator configuration. In this example, the overtone resonant mode is a vertical flexural mode at the $7^{th}$ overtone ($8^{th}$ harmonic) of the fundamental resonant frequency of the resonant structure 52 with each of the anchors 54 disposed at nodal points of the overtone resonant mode. The resonant structure 52 may be considered beam-shaped, despite both lateral dimensions of the structure 52 being greater than the thickness of the structure 52.

The $7^{th}$ overtone resonant mode is excited by a number of drive electrodes 56 (FIG. 3). As with the example of FIG. 1, the resonator device 50 is configured for fully differential operation. The drive electrodes 56 include both positive and negative electrodes. This example includes two positive drive electrodes and two negative drive electrodes. The overtone resonance of the device 50 is captured by a number of sense electrodes 57, half of which are positive (or non-inverting) and half of which are negative (or inverting). The resonator device 50 may nonetheless be configured for differential operation in which either the input or the output electrodes 56, 57 are single-ended. Each of the drive and sense electrodes 56, 57 is disposed at a position along the resonant structure 52 of maximum displacement during the overtone resonant vibration, as best shown in FIG. 3.

The resonant structure 52 is spaced from a substrate (FIG. 1) and the electrodes 56 by respective gaps 29 (FIG. 3). The resonant structure 52 is supported by the substrate via the anchors 54. The resonant structure 52 is coupled to the anchors via a number of support structures 58. The resonant structure 52 is configured for overtone resonant vibration relative to the substrate. The overtone resonant vibration has a set of nodal points. Each support structure 58 is positioned along the resonant structure 52 at a respective one of the nodal points of the overtone resonant mode. In this example, each nodal point has a respective one of the support structures 58, as best shown in FIG. 3.

The support structures 58 are disposed in a symmetrical arrangement similar to the arrangement described above in connection with the example of FIG. 1.

FIGS. 4 and 5 show another micromechanical resonator device 60 during operation in an overtone resonant mode. The device 60 may vibrate at the same mode shape (e.g., the $7^{th}$ overtone mode) as that described above in connection with the example of FIGS. 2 and 3. The overtone resonant vibration and differential operation of this embodiment may be similar in other respects to the examples described above. For example, the resonator device 60 may include a similar electrode arrangement having the drive/sense electrodes 56 disposed and configured as described above in connection with the example of FIGS. 2 and 3. The resonator device 60 differs from the above-described devices in that a resonant structure 62 of the device 60 is not supported at each nodal point of the overtone resonant mode. The resonator device 60 is shown in FIG. 5 with a reference line 64 indicating the locations of the nodal points. In this example, the resonator device 60 has a support structure 66 at every other nodal point. Skipping every other nodal point may minimize losses involving the support structures 66 and anchors 68 that support the resonant structure 62 above the substrate via the support structures 66.

More generally, the micromechanical structures of the disclosed devices need not be supported at each nodal point of the set of nodal points by a respective one of the plurality of support structures. That is, in some embodiments, the support structures of the disclosed devices do not support the micromechanical structure at each nodal point of the set of nodal points of the resonant mode. Thus, the set of nodal points may include supported nodal points 70 and unsupported nodal points 72 supported and not supported by a respective one of the plurality of support structures 66, respectively. In this example, every other nodal point is skipped along each side of the resonant structure 62.

The support structures 66 and, thus, the supported and unsupported nodal points 70, 72, may be disposed in a symmetrical arrangement along the micromechanical structure 62. In this example, the arrangement is again symmetrical in the lateral dimensions, as described above. The exemplary symmetrical arrangement includes matching or aligning locations of the supported and unsupported nodal points 70, 72 on opposing sides 74, 76 of the resonant structure 62. The other lateral symmetry is about the line passing through the two support structures 66 disposed in the middle of the resonant structure 62. The symmetrical arrangement of this example also disposes each of the supported nodal points 70 adjacent to one of the unsupported nodal points 72.

The above-described support structure arrangements may lead to multiple performance improvements. For example, FIG. 3 depicts the resonant spectrum of the exemplary embodiment of FIG. 1. The quality factor, Q, of the device is 14,010. Other operational parameters of the resonator device include an overtone resonant frequency of 70 MHz, a motional impedance of 10 kΩ, and a bias voltage of 1.4V. Resonator devices (such as the device 20 of FIG. 1) configured for operation at the $15^{th}$ overtone may exhibit such superior performance because the increased number of electrodes may lower the motional impedance. As a result, the resonators may operate with a lower bias voltage. Further operational improvements regarding, for instance, power handling are described below.

The quality factor and other performance characteristics of the other above-described embodiments are not adversely affected by skipping one or more support structures 66, as described above. In fact, lowering the number of support structures 66 may help improve one or more of the performance characteristics. One or more lateral or other symmetries of the support structure arrangement may also help maintain these operational improvements at the overtone resonant mode.

Notwithstanding these performance improvements, the disclosed devices may use other support structure arrangements in alternative embodiments, including, for instance, skipping two support structures for every supported nodal point, or supporting two support structures for every unsupported nodal point. Embodiments without missing support structures may also exhibit symmetry in the support structure arrangement. For example, the resonator device 20 of FIG. 1 has the support structures disposed in a lateral symmetrical arrangement. In that case and other embodiments, the positions of the support structures on opposing sides are aligned.

A variety of differential resonator device designs may be supported by the high overtone mode of the disclosed resonator devices. As shown in the examples of FIGS. 1-5, the differential resonator devices may have 16 electrodes, in which four electrodes are configured for positive drive, and another four electrodes are configured for negative drive. The remaining eight electrodes include another four electrodes configured for positive sensing, and the remaining four electrodes configured for negative sensing. Other fully differential resonator devices constructed in accordance with the disclosure may be configured for operation at the third overtone (fourth harmonic) and seventh overtone (eighth harmonic). Examples of such resonators are shown in FIGS. 7 and 8.

Figure 7:
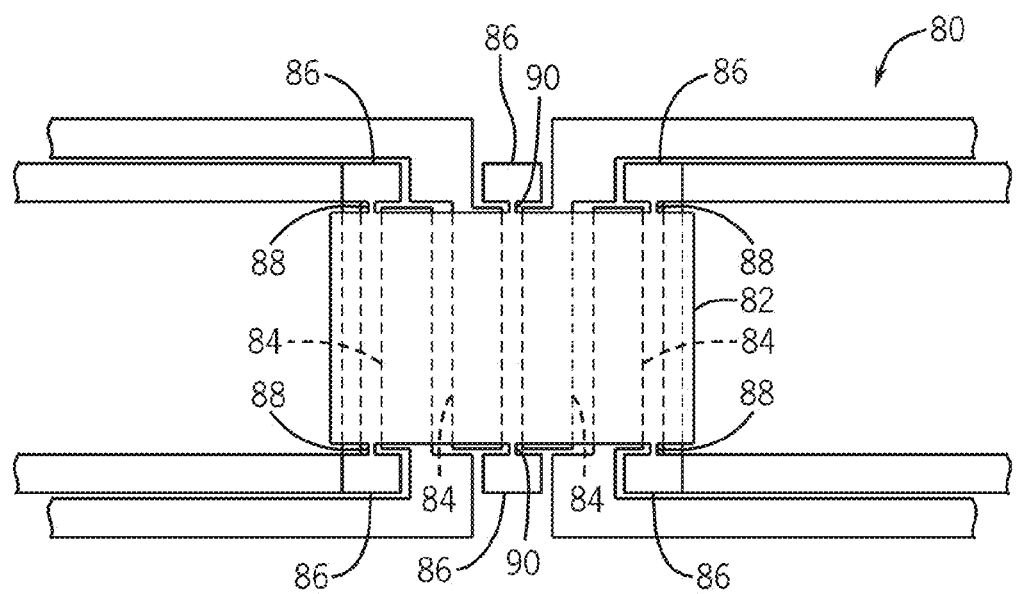
FIGS. 7 and 8 are schematic, layout views of exemplary micromechanical resonator devices configured for differential operation at seventh and third overtones of a fundamental frequency in accordance with alternative embodiments, respectively.

FIG. 7 depicts an exemplary resonator device 80 that may be configured for fully differential operation and resonance at the third overtone of the fundamental resonant frequency of a resonant structure 82. The device 80 includes four electrodes 84, each one of which may be dedicated to a discrete drive/sense function (e.g., positive and negative inputs and positive and negative outputs). The resonant structure 82 is supported by a substrate via a plurality of anchors 86 and support structures 88 coupling the anchors 86 to the resonant structure 82. The support structures 88 may be arranged symmetrically as described above. For example, the symmetry may include lateral alignment across the width of the resonant structure 82 and lateral symmetry about a center line passing through center support structures 90).

Figure 8:
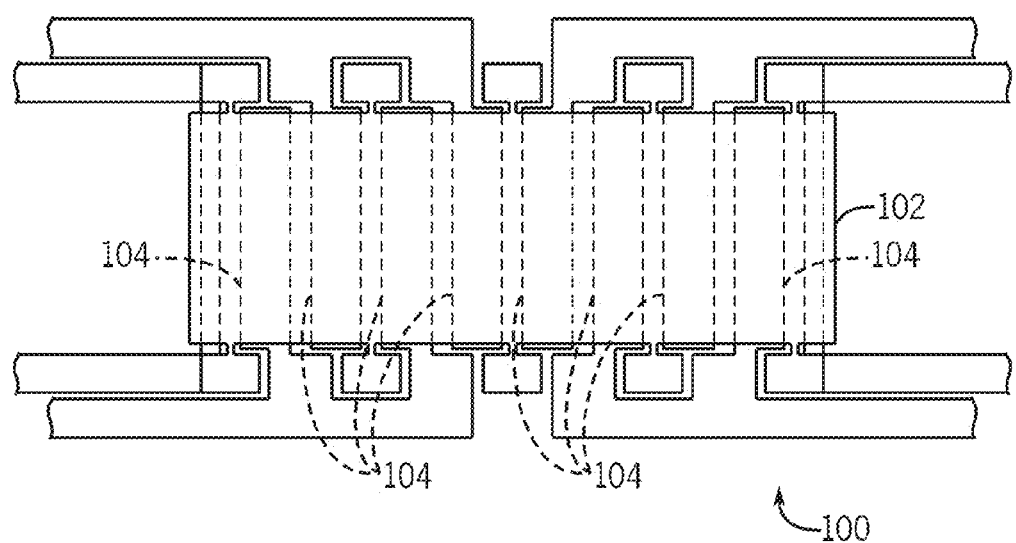

FIG. 8 depicts another exemplary resonator device 100 that may be configured for fully differential operation. In this example, the device 100 is configured for resonance at the $7^{th}$ overtone of the fundamental resonant frequency of a resonant structure 102. The device 100 includes eight electrodes 104, with pairs of the electrodes 104 dedicated to respective drive/sense functions. For example, the electrode pairs may be arranged in a manner similar to the groups of four electrodes described above in the example of FIG. 1. The device 100 may be otherwise configured similarly to the examples of FIG. 1 and FIG. 7.

Notwithstanding the foregoing examples, the disclosed resonator devices need not be configured for fully differential operation. For example, and as shown in the graphical plots described below, the disclosed devices may be configured with a single-ended input and differential outputs.

Figure 9A:
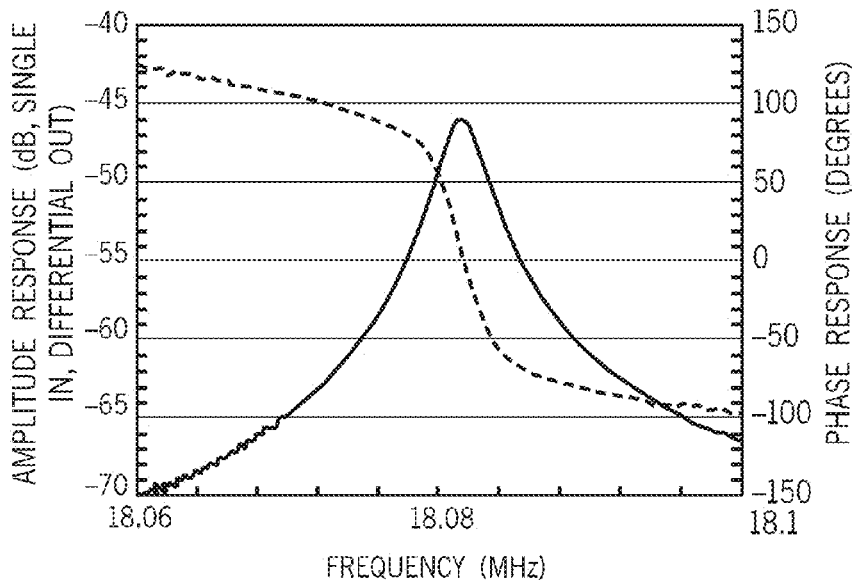
FIGS. 9A-9D are graphical plots depicting the performance of a free-free short support micromechanical resonator device configured for operation at a 15th overtone frequency of 18 MHz in accordance with one embodiment.
Figure 9B:
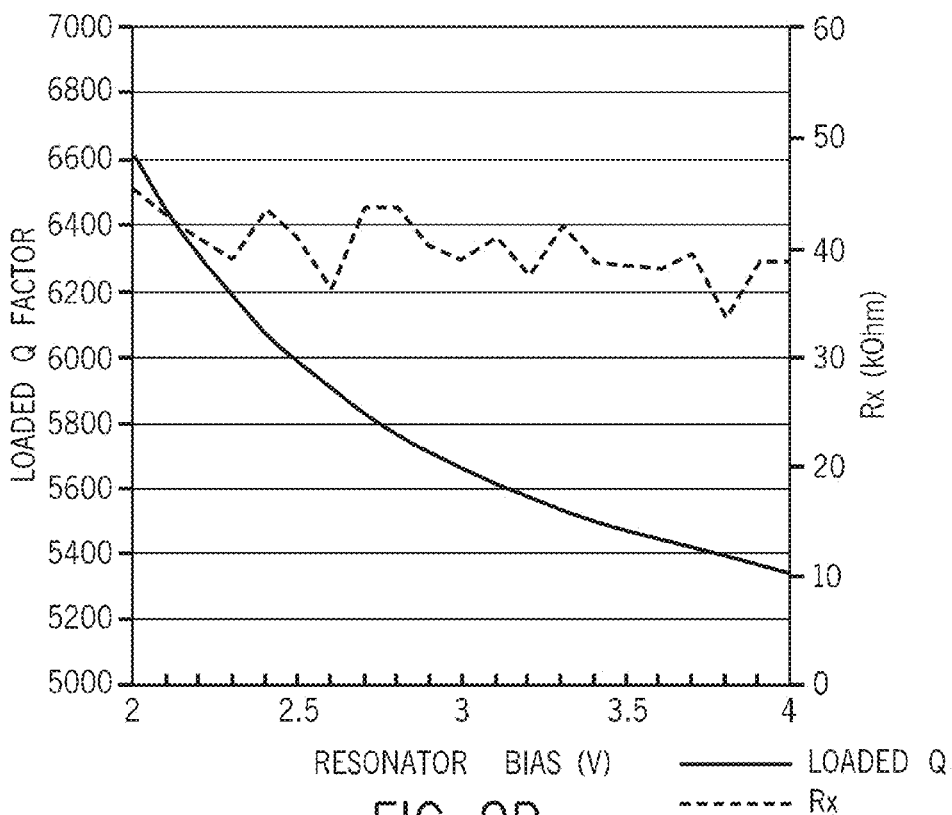
Figure 9C:
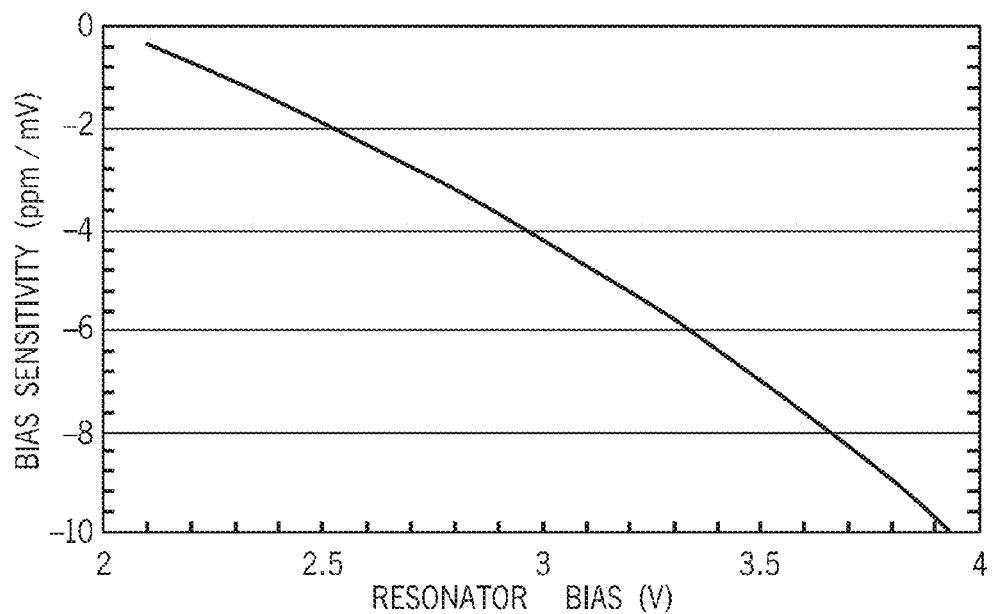
Figure 9D:
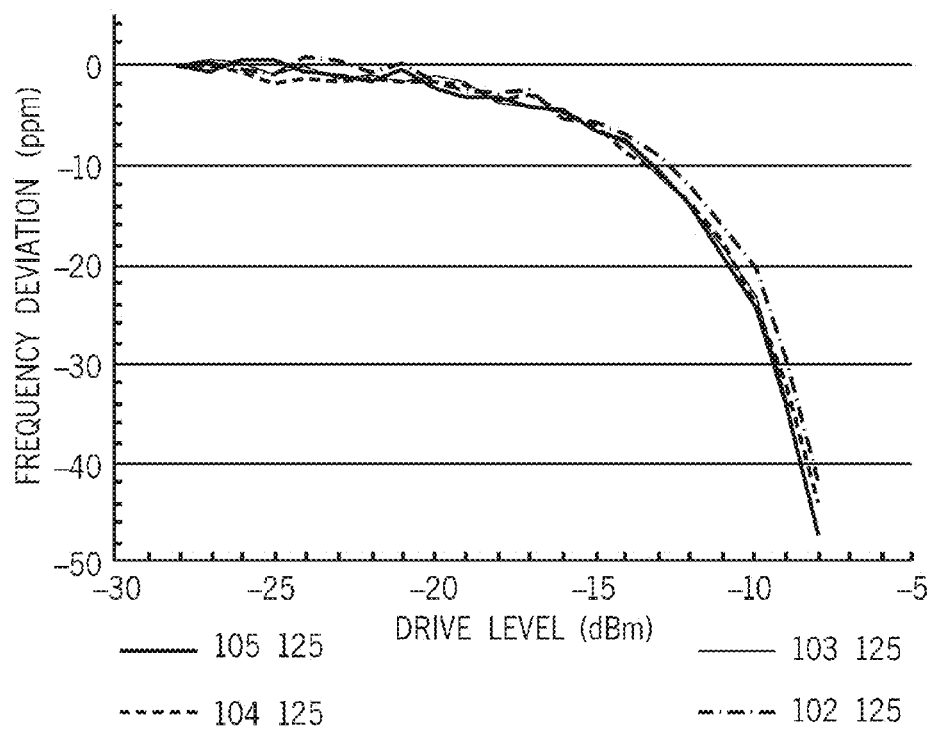

FIGS. 9A-9D are graphical plots depicting the performance of a free-free short support resonator device configured for operation at a $7^{th}$ overtone of 18 MHz with a single-ended input and differential output, but otherwise in accordance with the example described above in connection with FIGS. 4 and 5. FIG. 9A depicts the frequency spectrum and phase response of the resonator device. FIG. 9B depicts the quality factor, Q, and motional impedance as a function of bias voltage. FIG. 9C depicts the sensitivity of the operational frequency (i.e., the harmonic frequency) of the device as a function of bias voltage. FIG. 9D shows an improvement in power handling (e.g., about 10 dB) during operation of four samples of such 18 MHz devices.

Figure 10A:
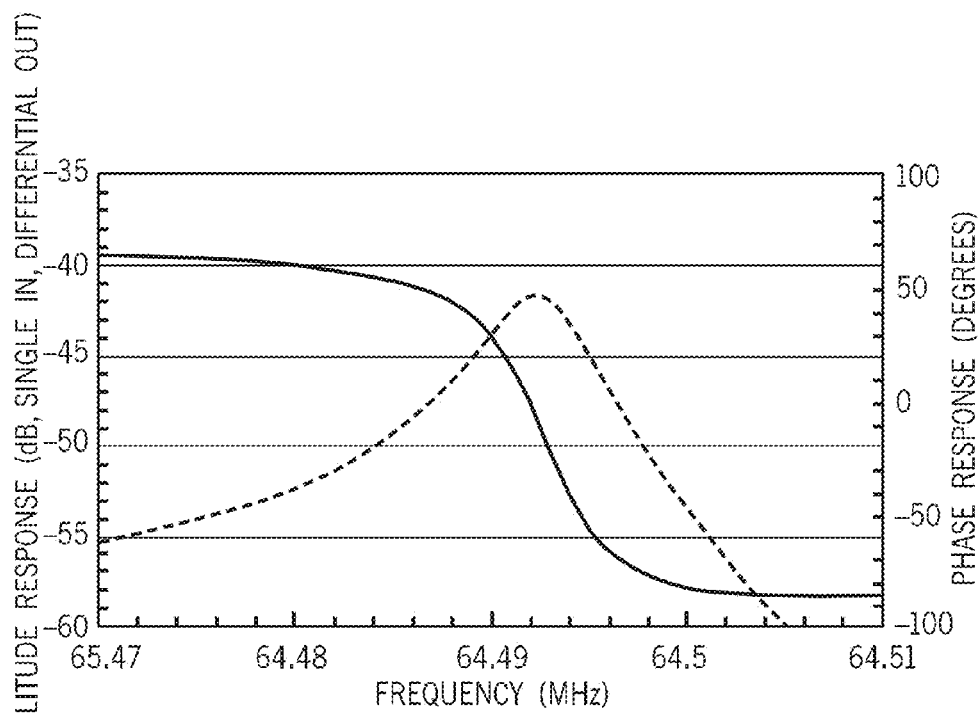
FIGS. 10A-10D are graphical plots depicting the performance of a free-free short support micromechanical resonator device configured for operation at a 15th overtone frequency of 64 MHz in accordance with one embodiment.
Figure 10B:
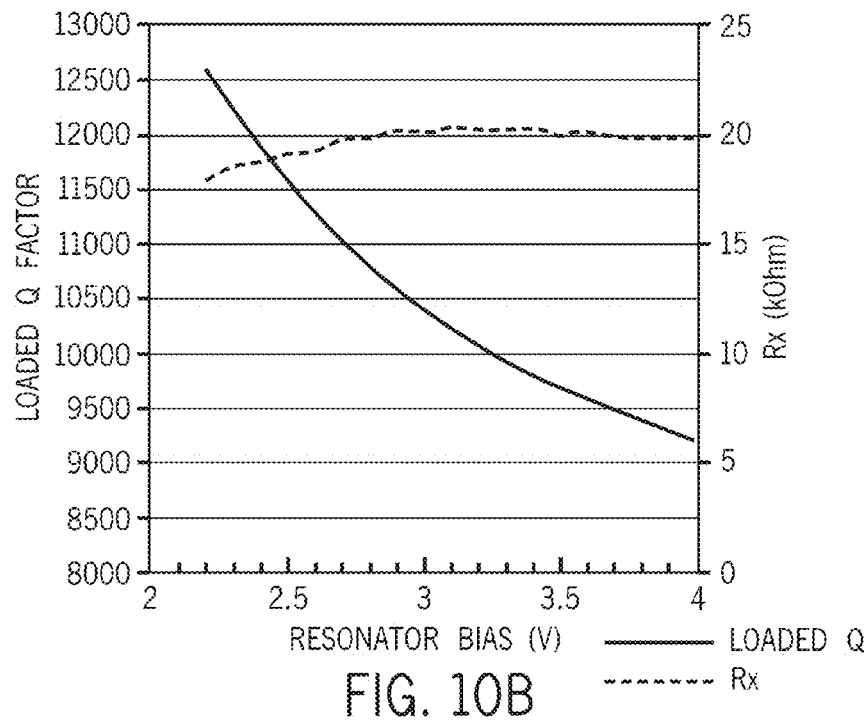
Figure 10C:
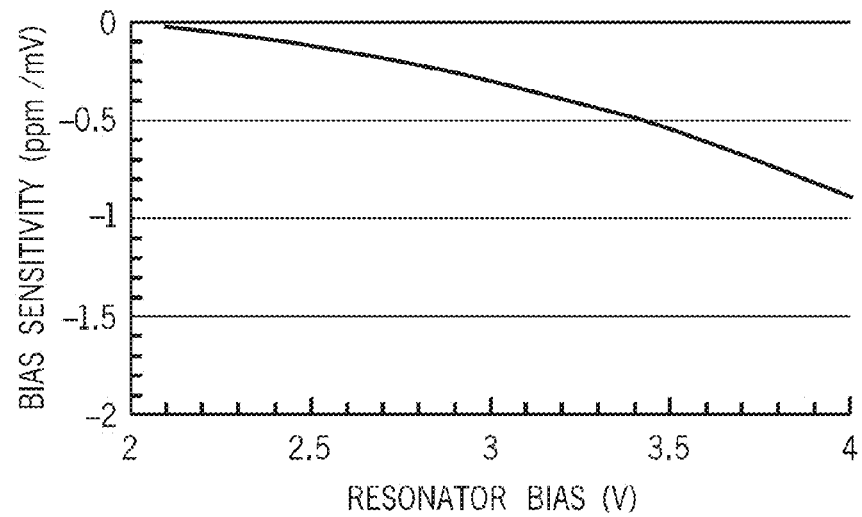
Figure 10D:
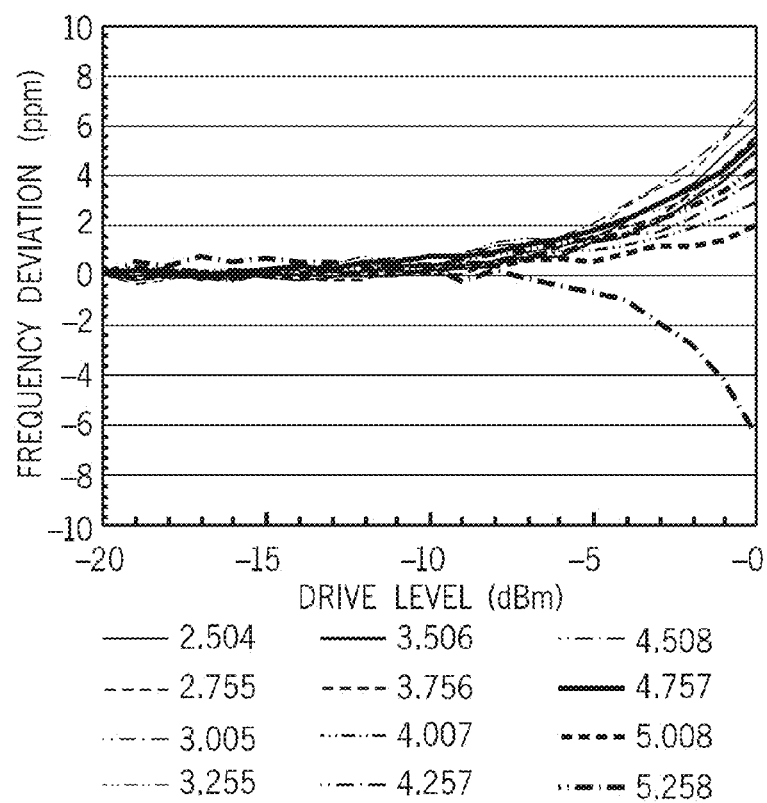

FIG. 10A-10D are graphical plots depicting the performance of a free-free short support resonator device configured for operation at an $15^{th}$ overtone of 64 MHz with a single-ended input and differential output, but otherwise in accordance with the example described above in connection with FIGS. 4 and 5. FIG. 10D shows an improvement in power handling (e.g., over about 20 dB) during operation of the 64 MHz device at varying bias voltages. The improvement also includes an upward frequency shift that may be useful in offsetting an opposite frequency shift that arises from a non-linear electrostatic effect of the resonator device design. The upward frequency shift shown in FIG. 10D may arise from a mechanical non-linearity arising from the operation at the overtone resonant mode.

The operational performance of the above-described high mode overtone free-free beam resonators with short support structures exhibited high quality factor levels, while exhibiting power handling levels at 0 dBm, the same level as quartz crystal resonators.

Figure 11:
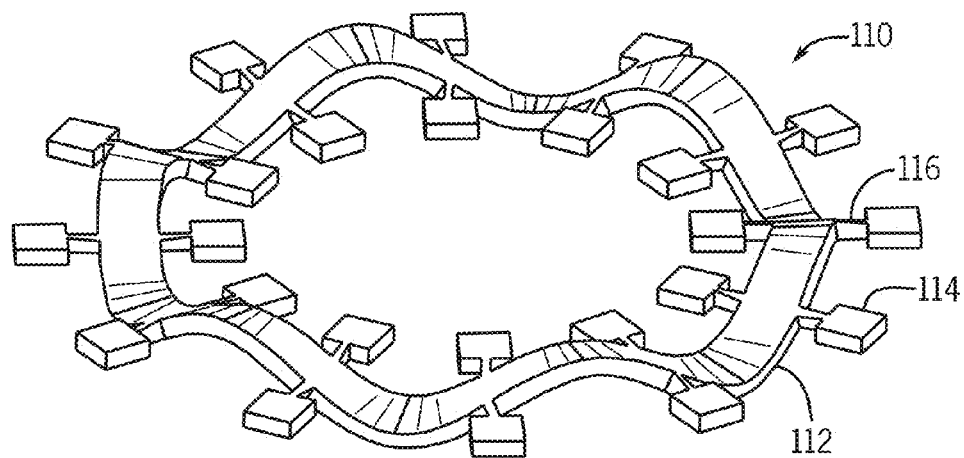
FIG. 11 is a schematic, partial, perspective view of an exemplary micromechanical resonator device having an annular micromechanical structure configured for overtone resonant vibration and differential operation in accordance with one embodiment.

FIG. 11 depicts another example of a resonator device 110 configured for operation at an overtone resonant mode. The resonator device 110 includes a beam-shaped resonant structure 112 configured for flexural vibration, as described above. The resonator device 110 may still be considered a free-free beam resonator, as the "ends" of the beam remain free of any clamp. In this example, the beam of the resonant structure 112 has a curved shape rather than a rectilinear one. The curve of the resonant structure 112 is oriented in parallel with the substrate such that the vibration remains vertical, or transverse relative to the substrate as shown. In this example, the curve of the resonant structure 112 forms a ring or annular shape. The curve of the resonant structure 112 may vary from the example shown, insofar as the resonant structure need not be bent to an extent that the ends thereof meet to form a ring as shown. Instead, the resonant structure 112 may have a semi-annular shape, with, for instance, the ends being disposed proximate to one another.

The resonator device 110 may include any number of anchors 114 and corresponding support arms or other structures 116. One or more of the support structures 116 may be skipped as described above. The resonator device 110 may include any number of electrodes (not shown) to support single-ended, partially differential, or fully differential operation. The electrodes may be dedicated to a particular drive or sense function (e.g., positive or negative inputs or outputs). Alternatively, one or more of the electrodes may be configured as a drive/sense electrode as described above.

Figure 12:
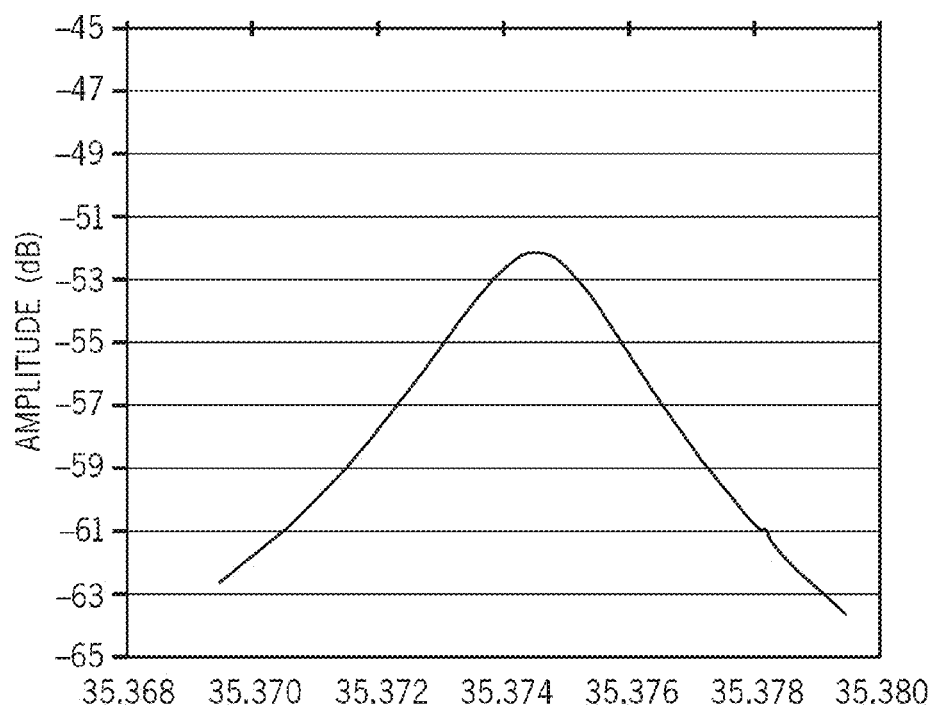
FIG. 12 is a graphical plot depicting the performance of the micromechanical resonator device of FIG. 11.

FIG. 12 depicts the performance of the ring-shaped resonator of FIG. 11. The quality factor, Q, of the ring-shaped resonator is about twice the level of current devices.

Figure 13:
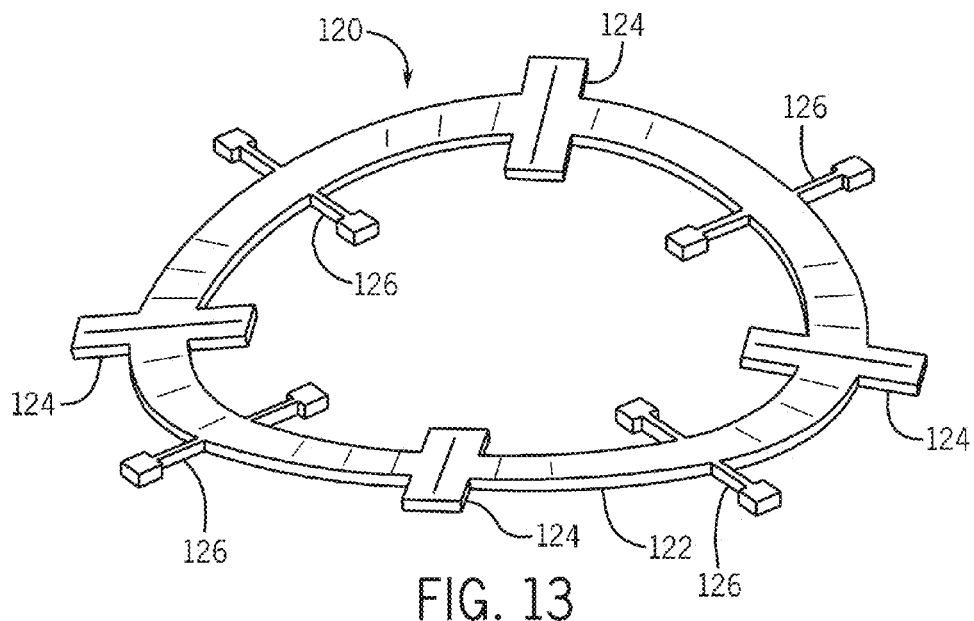
FIG. 13 is a schematic, partial, perspective view of another exemplary micromechanical resonator device having an annular micromechanical structure configured for overtone resonant vibration and differential operation at an overtone frequency of 1.4 MHz.
Figure 14:
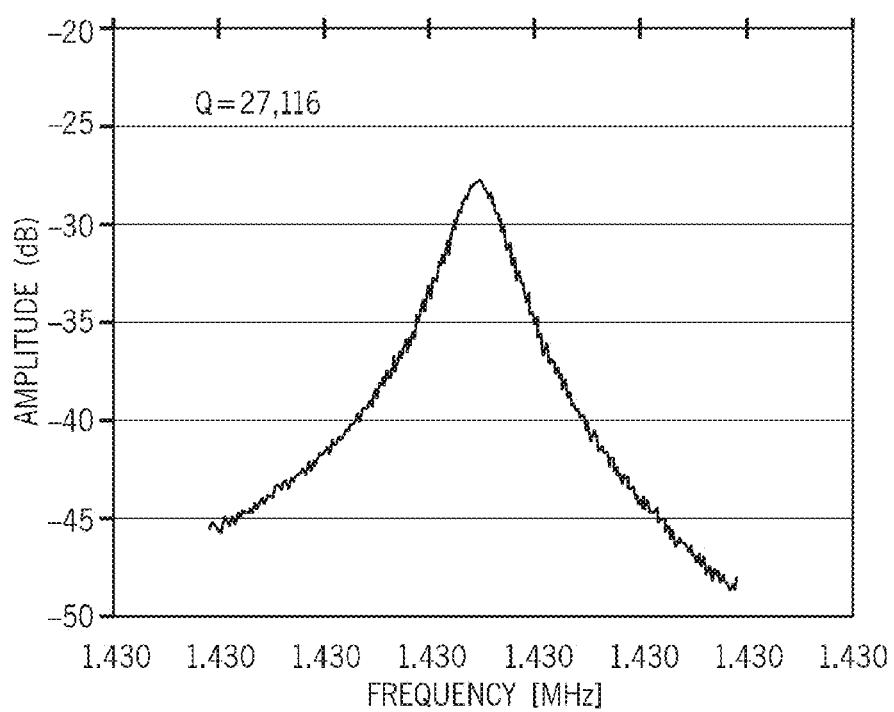
FIG. 14 is a graphical plot depicting the performance of the micromechanical resonator device of FIG. 13.

FIG. 13 depicts another ring-shaped overtone resonator device 120 configured for overtone resonant vibration at 1.4 MHz. The resonator device 120 may be configured similarly in one or more aspects to the above-described devices, including a beam-shaped resonant structure 122 bent into an annular configuration. In this embodiment, however, the resonant structure 122 has a non-uniform width. In this example, the non-uniform width of the resonant structure 122 is provided by a number of lateral projections 124. Each projection 124 adds mass to the resonant structure 124, which may reduce the fundamental and other resonant frequencies of the device 120. The projections 124 need not be shaped as beams or bars oriented transversely to the main or primary body of the resonant structure 122. The projections 124 may be positioned along the main body at midpoints between respective pairs of support structures 126. FIG. 14 depicts the frequency spectrum of the device 120. The quality factor, Q, is 27,116. Other performance improvements may also be achieved via the device design shown in FIG. 13, including, for instance, power handling levels of about 1-2 mV.

In one aspect of the disclosure, the disclosed resonator devices may include support structures placed at nodal points of a resonant structure in a symmetrical arrangement. Supporting the resonant structure at the nodal points may configure the resonant structure for vibration at a high, overtone resonant mode, such as the 15th overtone (16th harmonic) of the fundamental resonant frequency. Such high mode, overtone operation is not limited to the above-described free-free beam resonator examples.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

The foregoing description is given for clearness of understanding only, and no unnecessary limitations should be understood therefrom, as modifications within the scope of the invention may be apparent to those having ordinary skill in the art.

What is claimed is:

1. A micromechanical device comprising:
a substrate;
a plurality of support structures anchored to the substrate;
a micromechanical structure supported by the substrate via the plurality of support structures and configured for overtone resonant vibration relative to the substrate, the overtone resonant vibration having a set of nodal points along the micromechanical structure; and
a plurality of electrodes supported by the substrate and spaced from the micromechanical structure by respective gaps, the plurality of electrodes comprising multiple drive electrodes configured relative to the micromechanical structure to excite the overtone resonant vibration with a differential excitation signal, and further comprising multiple sense electrodes configured relative to the micromechanical structure to generate a differential output from the overtone resonant vibration;
wherein:
the plurality of support structures are coupled to the micromechanical structure between ends of the micromechanical structure;
each support structure of the plurality of support structures is disposed at a respective nodal point of the set of nodal points;
the multiple drive electrodes comprise a positive drive electrode and a negative drive electrode; and
the multiple sense electrodes comprise a positive sensing electrode and a negative sensing electrode.

2. The micromechanical device of claim 1, wherein the ends of the micromechanical structure are free ends.

3. The micromechanical device of claim 1, wherein the plurality of support structures are disposed on opposing sides of the micromechanical structure, each side extending along a lateral dimension of the micromechanical structure.

4. The micromechanical device of claim 3, wherein the lateral dimension is a length of the micromechanical structure.

5. The micromechanical device of claim 3, wherein the opposing sides are oriented in parallel with one another such that the micromechanical structure is beam-shaped.

6. A micromechanical device comprising:
a substrate;
a plurality of support structures anchored to the substrate;
a micromechanical structure supported by the substrate via the plurality of support structures and configured for overtone resonant vibration relative to the substrate, the overtone resonant vibration having a set of nodal points along the micromechanical structure; and
a plurality of electrodes supported by the substrate and spaced from the micromechanical structure by respective gaps, the plurality of electrodes comprising multiple drive electrodes configured relative to the micromechanical structure to excite the overtone resonant vibration with a differential excitation signal, multiple sense electrodes configured relative to the micromechanical structure to generate a differential output from the overtone resonant vibration, or both the multiple drive electrodes and the multiple sense electrodes;
wherein:
the plurality of support structures are coupled to the micromechanical structure between ends of the micromechanical structure;
each support structure of the plurality of support structures is disposed at a respective nodal point of the set of nodal points; and
the micromechanical structure is not supported at one or more of the set of nodal points;
the plurality of support structures are disposed on opposing sides of the micromechanical structure, each side extending along a lateral dimension of the micromechanical structure;
each support structure of the plurality of support structures on a first side of the opposing sides is aligned with another support structure of the plurality of support structures disposed on a second side of the opposing sides.

7. The micromechanical device of claim 1, wherein the overtone resonant vibration is at an overtone resonant frequency for the third overtone of a fundamental resonant frequency of the micromechanical structure.

8. The micromechanical device of claim 1, wherein the overtone resonant vibration is at an overtone resonant frequency for the seventh overtone of a fundamental resonant frequency of the micromechanical structure.

9. The micromechanical device of claim 1, wherein the overtone resonant vibration is at an overtone resonant frequency for the 15th overtone of a fundamental resonant frequency of the micromechanical structure.

10. The micromechanical device of claim 1, wherein the overtone resonant vibration is at an overtone resonant frequency for the 31st overtone of a fundamental resonant frequency of the micromechanical structure.

11. The micromechanical device of claim 1, wherein each support structure of the plurality of support structures has a length substantially less than a quarter-wavelength of a harmonic frequency of the overtone resonant vibration.

12. A micromechanical device comprising:
a substrate;
a plurality of support structures anchored to the substrate;
a micromechanical structure supported by the substrate via the plurality of support structures and configured for overtone resonant vibration relative to the substrate, the overtone resonant vibration having a set of nodal points along the micromechanical structure; and
a plurality of electrodes supported by the substrate and spaced from the micromechanical structure by respective gaps, the plurality of electrodes comprising multiple drive electrodes configured relative to the micromechanical structure to excite the overtone resonant vibration with a differential excitation signal, multiple sense electrodes configured relative to the micromechanical structure to generate a differential output from the overtone resonant vibration, or both the multiple drive electrodes and the multiple sense electrodes;
wherein:
the plurality of support structures are coupled to the micromechanical structure between ends of the micromechanical structure;
each support structure of the plurality of support structures is disposed at a respective nodal point of the set of nodal points; and
the micromechanical structure is not supported at one or more of the set of nodal points;

at least one of the multiple drive electrodes and at least one of the multiple sense electrodes is disposed between each pair of adjacent support structures of the plurality of support structures.

13. A micromechanical device comprising:
a substrate;
a plurality of support structures anchored to the substrate;
a micromechanical structure supported by the substrate via the plurality of support structures and configured for overtone resonant vibration relative to the substrate, the overtone resonant vibration having a set of nodal points along the micromechanical structure; and
a plurality of electrodes supported by the substrate and spaced from the micromechanical structure by respective gaps, the plurality of electrodes comprising multiple drive electrodes configured relative to the micromechanical structure to excite the overtone resonant vibration with a differential excitation signal, multiple sense electrodes configured relative to the micromechanical structure to generate a differential output from the overtone resonant vibration, or both the multiple drive electrodes and the multiple sense electrodes;
wherein:
the plurality of support structures are coupled to the micromechanical structure between free ends of the micromechanical structure;
each support structure of the plurality of support structures is disposed at a respective nodal point of the set of nodal points;
the micromechanical structure is not supported at one or more of the set of nodal points, and
each support structure of the plurality of support structures is laterally aligned with another support structure of the plurality of support structures.

14. The micromechanical device of claim 13, wherein the plurality of support structures are disposed in a symmetrical arrangement along the micromechanical structure.

15. The micromechanical device of claim 14, wherein the symmetrical arrangement divides the set of nodal points into an equal number of supported and unsupported nodal points.

16. The micromechanical device of claim 13, wherein the plurality of support structures are disposed on opposing sides of the micromechanical structure.

17. The micromechanical device of claim 13, wherein the overtone resonant vibration is at an overtone resonant frequency for the third overtone of a fundamental resonant frequency of the micromechanical structure.

18. The micromechanical device of claim 13, wherein the overtone resonant vibration is at an overtone resonant frequency for the seventh overtone of a fundamental resonant frequency of the micromechanical structure.

19. The micromechanical device of claim 13, wherein the overtone resonant vibration is at an overtone resonant frequency for the 15th overtone of a fundamental resonant frequency of the micromechanical structure.

20. The micromechanical device of claim 13, wherein the overtone resonant vibration is at an overtone resonant frequency for the 31st overtone of a fundamental resonant frequency of the micromechanical structure.

* * * * *